United States Patent
Tseng et al.

(10) Patent No.: US 7,323,733 B2
(45) Date of Patent: Jan. 29, 2008

(54) NONVOLATILE MEMORY AND FABRICATION METHOD THEREOF

(75) Inventors: Tseung-Yuen Tseng, Hsinchu (TW); Chih-Yi Liu, Tainan County (TW); Pei-Hsun Wu, Taichung County (TW)

(73) Assignee: Winbond Electronics Corp., Hsinchu (TW)

( * ) Notice: Subject to any disclaimer, the term of this patent is extended or adjusted under 35 U.S.C. 154(b) by 63 days.

(21) Appl. No.: 11/108,823

(22) Filed: Apr. 19, 2005

(65) Prior Publication Data

US 2006/0131628 A1    Jun. 22, 2006

(30) Foreign Application Priority Data

Dec. 21, 2004   (TW) .............. 93139826 A

(51) Int. Cl.
  *H01L 29/94* (2006.01)
(52) U.S. Cl. ............ 257/295; 257/537; 257/298; 438/3; 438/222

(58) Field of Classification Search ............... None
See application file for complete search history.

(56) References Cited

U.S. PATENT DOCUMENTS

| | | | |
|---|---|---|---|
| 6,965,137 B2 * | 11/2005 | Kinney et al. ............ 257/295 |
| 2004/0228172 A1 * | 11/2004 | Rinerson et al. ........... 365/158 |
| 2005/0226062 A1 * | 10/2005 | Aratani et al. ............ 365/199 |
| 2005/0260839 A1 * | 11/2005 | Allenspach et al. ....... 438/584 |

* cited by examiner

*Primary Examiner*—Leonardo Andujar
(74) *Attorney, Agent, or Firm*—Birch, Stewart, Kolasch & Birch, LLP

(57) ABSTRACT

A nonvolatile memory and a fabrication method thereof. The nonvolatile memory includes a substrate, a bottom electrode deposited on the substrate, a resistor layer deposited on the bottom electrode, and a top electrode on the resistor layer. The bottom electrode includes $LaNiO_3$ and the resistor layer includes doped $SrZrO_3$.

5 Claims, 3 Drawing Sheets

NONVOLATILE MEMORY AND FABRICATION METHOD THEREOF

BACKGROUND

The present invention relates to a non-volatile memory and a fabrication method thereof, and more particularly, to a resistor type non-volatile memory and a fabrication method thereof.

Memory devices are typically divided into volatile and non-volatile types. For volatile memory devices, such as DRAM or SRAM, a continuous power supply is required to store data. For non-volatile memory devices, such as ROM, data can be stored therein for long periods of time without power supply.

As mobile phones, digital cameras, personal digital assistants (PDAs), notebooks, and other portable electronic devices become more popular, non-volatile memory devices are widely applied thereto due to advantages of retaining stored data without requiring power supply and low energy consumption overall. Among non-volatile memory devices, flash memory is the mainstream nowadays. As the semiconductor technology improves, flash memory devices face challenges of high operating voltage and gate oxidethinning, causing the unsatisfactory retention time. Thus, many new non-volatile memories are developed to replace flash memories. Among various emerging non-volatile memories, resistive non-volatile memory provides advantages of high write and erase speeds, low operating voltage, long retention time, simple structure, low power consumption, small size, and low cost.

FIG. 1 is a schematic diagram of a conventional resistor type non-volatile memory 10, disposed on a substrate 12, comprising a dielectric layer 14, a bottom electrode 16, a resistor layer 18, and a top electrode 20. The bottom electrode 16 comprises a platinum film. The resistor layer 18 comprises a chromium (Cr) doped strontium titanate single crystal and provides reversible resistance switching.

FIG. 2 shows the relationship between a bias and leakage current of conventional non-volatile memory 10. As shown in FIG. 2, when the bias voltage applied on the resistive non-volatile memory 10 increases positively from 0 V, the leakage current increases along the curve C1. However, when the positive bias exceeds V1, the relationship between the bias and leakage current suddenly switches to the curve C2. At that time, leakage current reduces immediately. The relationship therebetween follows the curve C2, even if the bias is reduced again. Until a negative bias less than V2 is applied to the resistive non-volatile memory 10, the relationship between the bias and the leakage current switches back to the curve C1 along with a suddenly increased negatively leakage current, which means the resistance of the resistive non-volatile memory 10 is reduced. Because of the special characteristics of resistance switching, the resistive non-volatile memory can be used as a memory. For example, these two different resistances can be used to represent 0 and 1 respectively. When write or erase is required in the memory device, they can be easily implemented by applying proper voltage to the resistive non-volatile memory 10 to change resistance. In addition, data stored therein is retained without power supply.

However, according to the conventional method of fabricating a resistive non-volatile memory, the fabrication of the bottom electrode 16 still presents problems. For example, the platinum film used in the bottom electrode 16 is extremely expensive. Also, in the conventional method of fabricating the resistive layer 18, two methods are typically used. In one, a single crystal structure of $SrTiO_3$ is formed with an orientation (100) and then undergoes flame fusion to form a Cr doped $SrTiO_3$ single crystal. Alternatively, a pulse laser sputtering process is used to grow a Cr doped $SrZrO_3$ film. However, the single crystal structure used in the previous method also has high cost. The latter one is not suitable to form a large area film. Thus, neither method can meet requirements of mass production.

Thus, a new resistive non-volatile memory structure and a fabrication method thereof are desirable.

SUMMARY

In an embodiment of a non-volatile memory, a non-volatile memory comprises a substrate, a bottom electrode comprising $LaNiO_3$ film disposed on a substrate, a resistor layer comprising $SrZrO_3$ film disposed on the bottom electrode, and a top electrode disposed on the resistor layer.

In an exemplary embodiment of a method of fabricating a non-volatile memory, a substrate is first provided. A bottom electrode is then formed on the substrate by RF magnetos sputtering. A resistor layer comprising $SrZrO_3$ film is formed on the bottom electrode and a top electrode is formed on the resistor layer.

In an exemplary embodiment of a method of fabricating a non-volatile memory, a substrate is first provided. A dielectric layer is formed on the substrate. A bottom electrode comprising $LaNiO_3$ film is formed on the dielectric layer. A resistor layer comprising $SrZrO_3$ film is formed on the bottom electrode and a top electrode is formed on the resistor layer.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the an front this detailed description.

DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION

Figure 1:
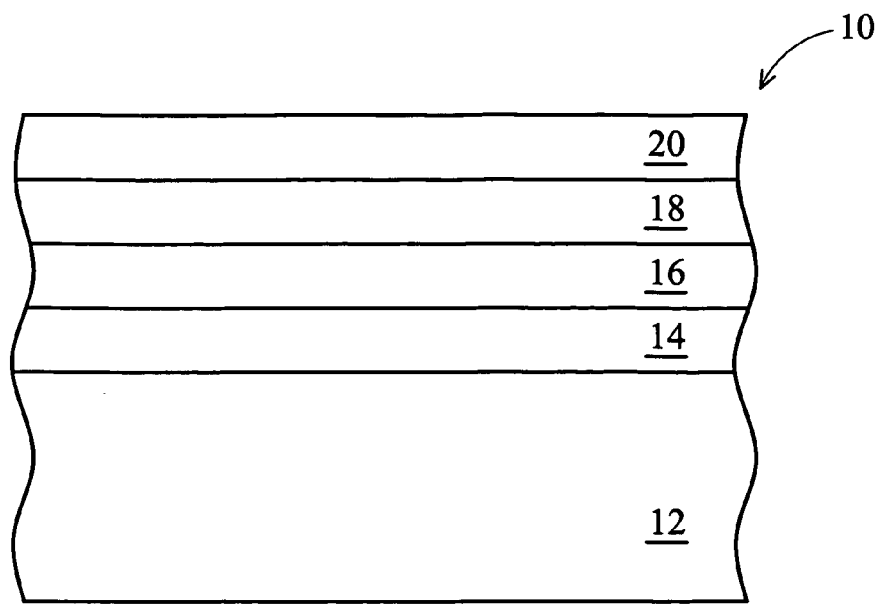
FIG. 1 indicates a cross-section of a conventional resistive non-volatile memory.
Figure 2:
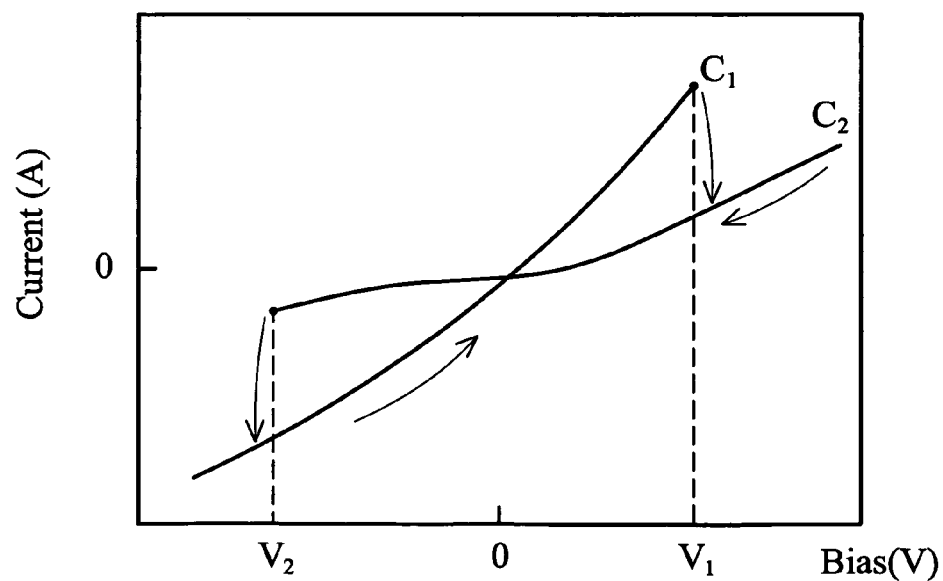
FIG. 2 shows the relationship between a bias and leakage current in a resistive non-volatile memory.
Figure 3:
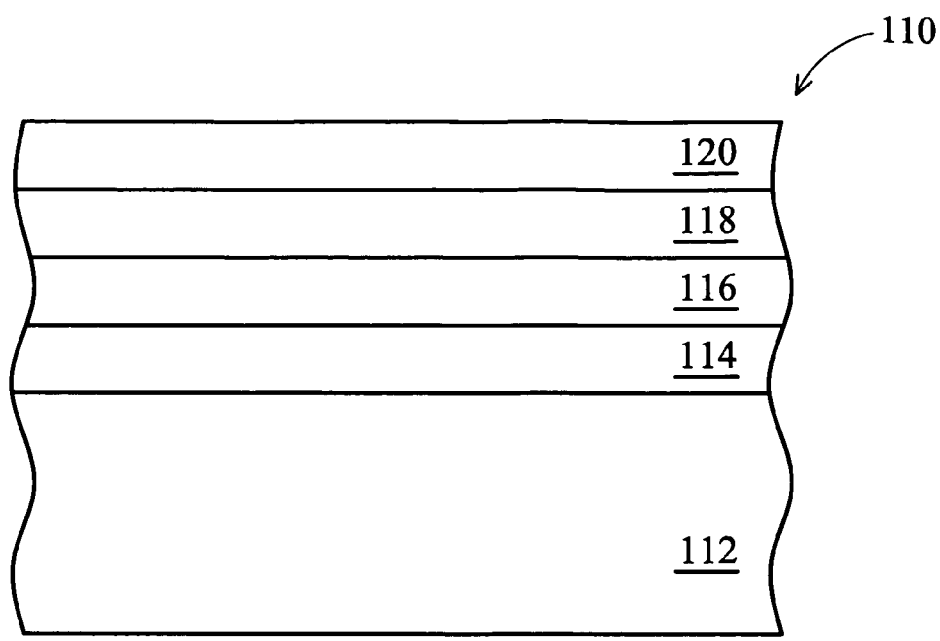
FIG. 3 depicts a cross-section of a first embodiment of a resistive non-volatile memory of the invention.

FIG. 3 shows a cross-section of a first embodiment of a resistive non-volatile memory 110 of the invention. As shown in FIG. 3, the memory 110 comprises a substrate 112, a dielectric layer 114, a bottom electrode 116, a resistor layer 118, and a top electrode stacked in sequence.

In an embodiment of the memory, the dielectric layer 114 comprises a silicon oxide layer with a thickness of 100 to 500 nm. The bottom electrode 116 comprises a LaNiO$_3$ film of highly preferred (100) and (200) orientation structure at a thickness of about 10 nm to 1000 nm. The resistor layer 118 comprises SrZrO$_3$ film doped with dopant comprising V, Fe, Nb, or combination thereof. The dopant concentration is about 0.05% to 1% by atomic percentage. The thickness of the resistor layer 118 is about 20 nm to 500 nm. The top electrode 120 comprises an aluminum film.

In an embodiment of a method of fabricating the non-volatile memory 110, a substrate 112, such as a silicon substrate, is first provided and then cleaned by standard Radio Corporation of America (RCA) cleaning process. After cleaning, a silicon oxide layer is thermally grown on the substrates 112 as the dielectric layer 114 to isolate leakage current from the substrate 112. Then, a radio-frequency (RF) magnetos sputtering process is performed to form a LaNiO$_3$ film on the dielectric layer 114 as the bottom electrode 116. In the radio-frequency magnetos sputtering process, the LaNiO$_3$ film is grown at 300 centigrade degree. Plasma power density is about 23.3 W/cm$^2$, with working pressure 40 mTorr and air flow rate 40 sccm. The ratio between AR and O$_2$ is 6:4. Note that the formed LaNiO$_3$ film has a highly preferred orientation structure, such as (100) or (200). In addition, this preferred orientation can remain after processing sequent thermal processes to ensure stability of the bottom electrode 116.

Then, a radio-frequency magnetos sputtering process is performed using SrZrO$_3$ as a target material to form a SrZrO$_3$ film with a thickness of 50 nm to 100 nm on the bottom electrode 116 as the resistor layer 118. In an embodiment, the target material is doped with dopant comprising V, Fe, Nb, or a combination thereof at a dopant concentration about 0.05% to 1% by atomic percentage. As a result, the resistor layer 118 formed on the bottom electrode 116 has a responded dopant concentration. In addition, the growth temperature of the resistor layer 118 is about 450 centigrade degree. Plasma power density is about 23.3 W/cm$^2$, with working pressure about 10 mTorr, and air flow rate about 40 sccm. The ratio between AR and O$_2$ is about 6:4. A thermal evaporating process is performed to form an aluminum film having a thickness of 300 nm on the resistor layer 118. A patterning process performed with a proper mask defines a pattern of the aluminum film to form the top electrode 120.

Figure 4:
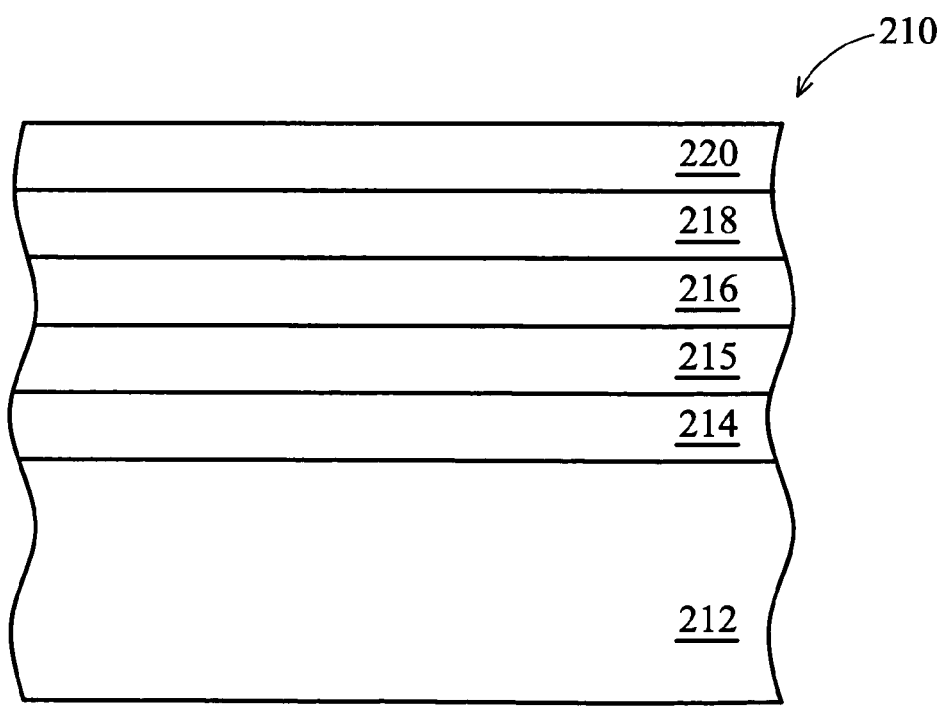
FIG. 4 shows a cross-section of a second embodiment of a resistive non-volatile memory of the invention.

An embodiment of the non-volatile memory further comprises a buffer layer disposed between the dielectric layer and the bottom electrode layer. FIG. 4 indicates a cross-section of a second embodiment of the non-volatile memory 210 of the invention. As shown in FIG. 4, the non-volatile memory 210 is similar to the non-volatile memory 110 except for an additional buffer layer 215 disposed between the dielectric layer 214 and the bottom electrode layer 216. Other structures are formed by the same materials and methods as those in the non-volatile memory 110, which have been mentioned previously. Thus, only the fabrication method of the buffer layer 215 is described herein.

In this embodiment, after the dielectric layer is completed, a radio-frequency magnetos sputtering process forms a SrTiO$_3$ film as the buffer layer 215 having a thickness of about 20 nm to 100 nm. A similar procedure can form the bottom electrode 216, which tends to have the same preferred orientation as the buffer layer 215. Thus, the preferred orientation of the bottom electrode 216 is designed more easily. For example, due to physical properties, the LaNiO$_3$ film with a preferred orientation (110) is difficult to form directly. However, if a buffer layer 215 with a preferred orientation (110) has been formed previously, the LaNiO$_3$ film with the preferred orientation (110) can be formed easily thereon. In other words, the preferred orientation can be controlled more easily, thereby improving electrical performance of products.

Figure 5:
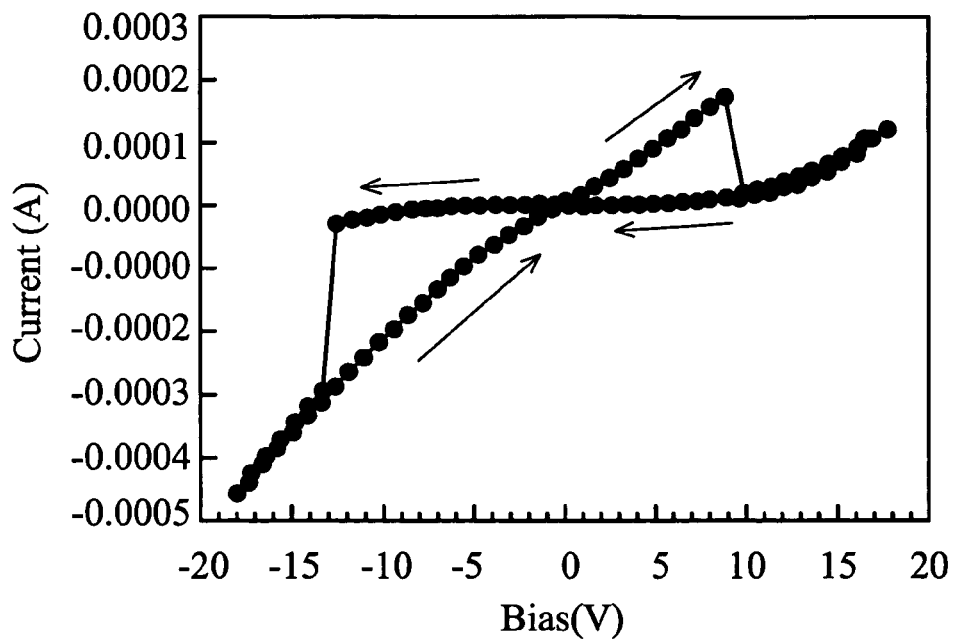
FIG. 5 shows the relationship between a bias and leakage current in an embodiment of a resistive non-volatile memory in the invention.

FIG. 5 shows the relationship between a bias and leakage current in an embodiment of a resistive non-volatile memory in the invention. As shown in FIG. 5, it is obvious that two different resistances, which switch at bias about 10 V or −13 V, can be distinguished clearly to meet the requirements of the resistive non-volatile memory.

Figure 6:
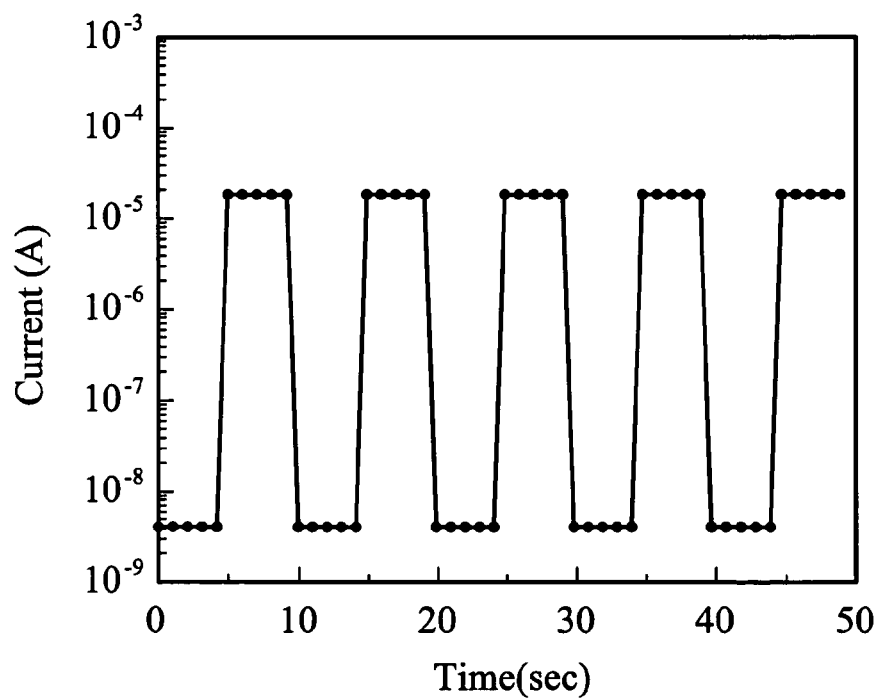
FIG. 6 shows the relationship between leakage current and time in an embodiment of a resistive non-volatile memory in the invention.

FIG. 6 shows the relationship between leakage current and time in an embodiment of a resistive non-volatile memory in the invention. This experimental result is obtained by applying a pulse with a period of 500 μsec and vibration amplitude of 20 V to the resistive non-volatile memory. As shown in FIG. 6, it is obvious that the non-volatile memory can switch its resistance in a very short time and generate a leakage current varying in a 10$^3$ order, fully meeting the requirement for high speed write and erase in resistive non-volatile memory.

In comparison with conventional process, the magnetos sputtering method in the invention not only has advantages of low cost and easier process control, but also uses LaNiO$_3$ as the bottom electrode, such that expensive platinum can be avoided. Furthermore, the crystallization temperature is relatively low, allowing effective reduction of the temperature during the fabrication process. Hence, heat damage in the fabrication process can be reduced and product performance further improved. In addition, the present invention provides a method of controlling orientation of the bottom electrode to improve the orientation of the bottom electrode and the resistor layer disposed thereon, improving electrical performance of the memory device.

While the invention has been described by way of example and in terms of preferred embodiment, it is to be understood that the invention is not limited thereto.

What is claimed is:

1. A method of fabricating a non-volatile memory, comprising:
   providing a substrate;
   forming a bottom electrode over the substrate by sputtering;
   forming a resistor layer comprising SrZrO$_3$ film on the bottom electrode; and forming a top electrode on the resistor layer, wherein the bottom electrode has a preferred orientation comprising (100), (200), or (110).

2. A method of fabricating a non-volatile memory, comprising:
   providing a substrate;
   forming a bottom electrode over the substrate by sputtering;
   forming a resistor layer comprising SrZrO$_3$ film on the bottom electrode;
   forming a top electrode on the resistor layer; and forming a buffer layer before forming the bottom electrode, the buffer layer having a preferred orientation and the bottom electrode formed thereon having the same preferred orientation as the buffer layer.

3. The method as claimed in claim 2, wherein the bottom electrode has a preferred orientation comprising (100), (200), or (110).

4. A method of fabricating a non-volatile memory, comprising:

provided a substrate;

forming a dielectric layer over the substrate;

forming a bottom electrode comprising $LaNiO_3$ film on the dielectric layer;

forming a resistor layer comprising $SrZrO_3$ film doped with dopants comprising V, Fe, Nb, or a combination thereof on the bottom electrode; and forming a top electrode on the resistor layer.

5. A method of fabricating a non-volatile memory, comprising:

providing a substrate;

forming a bottom electrode over the substrate by sputtering;

forming a resistor layer comprising $SrZrO_3$ film on the bottom electrode; and forming a top electrode on the resistor layer, wherein the bottom electrode has a preferred orientation.

* * * * *